United States Patent
Schnabel et al.

(10) Patent No.: US 6,528,769 B2
(45) Date of Patent: Mar. 4, 2003

(54) CONNECTION OF A JUNCTION TO AN ELECTRICAL CONDUCTOR TRACK ON A PLATE

(75) Inventors: Roland Schnabel, Hofheim (DE); Kurt Schaupert, Hofheim (DE); Harry Engelmann, Ingelheim (DE)

(73) Assignee: Schott Glas, Mainz (DE)

( * ) Notice: Subject to any disclaimer, the term of this patent is extended or adjusted under 35 U.S.C. 154(b) by 48 days.

(21) Appl. No.: 09/826,514

(22) Filed: Apr. 4, 2001

(65) Prior Publication Data

US 2001/0030185 A1 Oct. 18, 2001

(30) Foreign Application Priority Data

Apr. 13, 2000 (DE) .......................................... 100 18 415

(51) Int. Cl.[7] ................................................ H05B 3/68
(52) U.S. Cl. .................................. 219/446.1; 219/460.1
(58) Field of Search ........................... 219/446.1, 447.1, 219/461.1, 444.1, 543, 267, 460.1, 541

(56) References Cited

U.S. PATENT DOCUMENTS

| | | | | |
|---|---|---|---|---|
| 3,569,787 A | * | 3/1971 | Palmer | ........................ 219/267 |
| 3,999,040 A | * | 12/1976 | Ellis | ............................ 219/543 |
| 4,237,368 A | | 12/1980 | Welch | |
| 4,330,704 A | | 5/1982 | Jensen | |
| 4,437,604 A | | 3/1984 | Razon et al. | |
| 6,072,162 A | * | 6/2000 | Ito et al. | .................... 219/444.1 |
| 6,100,506 A | * | 8/2000 | Colelli, Jr. et al. | ...... 219/446.1 |
| 6,150,636 A | * | 11/2000 | Bogdanski et al. | ....... 219/461.1 |
| 6,184,501 B1 | * | 2/2001 | Zapf | ........................ 219/447.1 |

FOREIGN PATENT DOCUMENTS

| | | |
|---|---|---|
| DE | 40 22 845 C2 | 1/1992 |
| DE | 692 04 564 T2 | 5/1996 |
| DE | 197 07 664 A1 | 10/1997 |
| DE | 197 11 541 A1 | 9/1998 |
| EP | 465 173 | 1/1992 |
| EP | 607 929 | 7/1994 |
| JP | 59-090938 A | 5/1984 |
| JP | 61-071643 A | 6/1994 |
| JP | 62-252558 A | 9/1994 |
| WO | 88/05428 | 7/1988 |
| WO | 96/17405 | 6/1996 |

* cited by examiner

Primary Examiner—Teresa Walberg
Assistant Examiner—Leonid Fastovsky
(74) Attorney, Agent, or Firm—Fulbright & Jaworski LLP

(57) ABSTRACT

A connection of an electrical terminal 13 to a conductor track 5 applied to a glass or glass ceramic plate 1 is to be resistant to temperature change and traction and conductive. For this purpose an electrically conductive connecting element 11 is ultrasonically welded to the composite consisting of the conductor track 5 and plate 1. The connecting element 11 extends to the terminal 13 which is fastened to the plate 1.

15 Claims, 1 Drawing Sheet

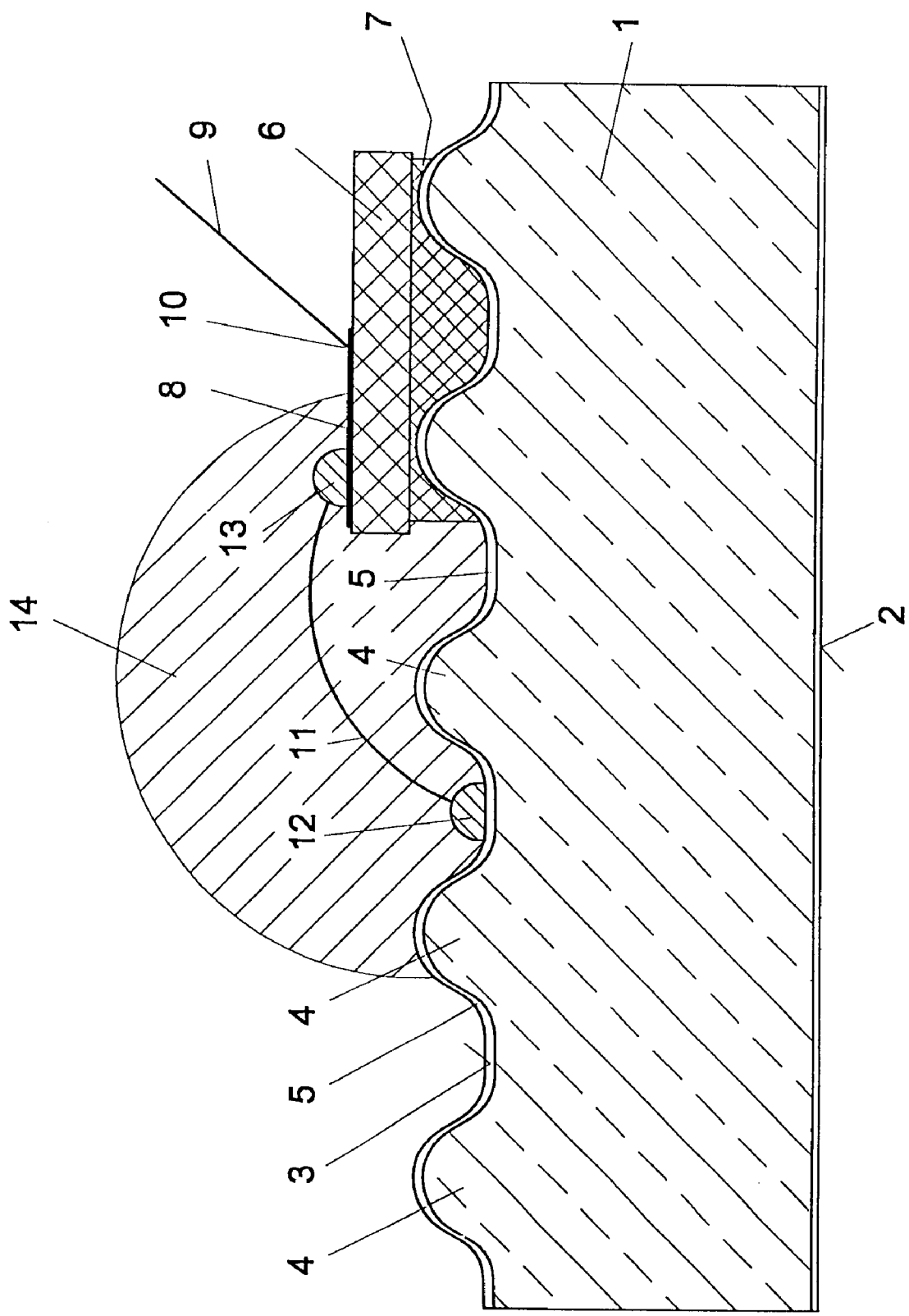

CONNECTION OF A JUNCTION TO AN ELECTRICAL CONDUCTOR TRACK ON A PLATE

The invention relates to a connection of at least one electrical junction to a conductor track applied to a board, especially a glass plate or glass ceramic plate.

In DE 40 22 845 C2 it is described that metal coatings which are applied to a glass ceramic plate by the screen printing method can be connected to electrical contacts by soldering or cementing. It has been recognized that soldering or cementing does not result in a lasting, tight, electrically conductive connection.

In DE 197 07 664 A1 a conductor track is described, which is applied to a glass ceramic plate. Since the contacting points on the glass ceramic plate serving as a cooking burner are complicated to create, mechanical contacting by contact pins was proposed.

In WO 88/05 428 A1 it is disclosed that an electronic component (chip) with a conductor board can be connected by pieces of wire by ultrasonic welding.

In U.S. Pat. No. 4,237,368 and DE 40 22 845 C2, temperature sensors on a glass ceramic cooking burner are described. Conductor tracks are applied to the glass ceramic plate. The formation of the junctions is not dealt with.

In DE 197 11 541 A1 it is found that a metal foil can be cemented to the pebbled bottom of a glass ceramic hot plate.

In DE 692 04 564 T2 there is described a method for the non-electrical metallization of a pattern of material other than glass on a glass support. The metallization is said to be suitable for the application of connections for other elements, including the method of ultrasonic welding.

The invention is addressed to the problem of proposing a connection of the kind referred to in the beginning, which is corrosion-proof, resistant to temperature change, resistant to pulling, and electrically conductive.

The above problem is solved by the claimed features.

In the ultrasonic welding of the connecting element to the composite consisting of conductor track and plate, the connecting element is fastened not just superficially to the conductor track, as in the case of soldering or cementing. Instead, in the ultrasonic welding a seam is formed which extends through the very thin conductor track and includes the latter. In addition to the composite created by the application of the conductor track to the plate, there is an additional binding force between the conductor track and the plate. Therefore, all three participants in the composite, namely the plate, the conductor track and the connecting element are combined in one unit. It follows that the connecting element is locked to the composite between the plate and conductor track, and especially the plate as the stable supporting element, in a manner resistant to traction and temperature change. In spite of the considerably different thermal expansion coefficients of the plate and conductor track, no loosening of the bond is thus to be feared.

Between the connecting element and the conductor track, the ultrasonic welding process necessarily produces a high electrical conductivity. The ultrasonic bond is also substantially more resistant to corrosion than a solder or cement bond.

In contrast to a soldered junction, ultrasonic welding also prevents the plate, especially the glass ceramic plate, from being exposed to great thermal point stress which might impair its long-term strength.

The plate has a nubby surface and the conductor track or tracks are applied to the nubby surface. To improve the structure and the reliable bond, the connecting element is ultrasonically welded to the composite conductor track and plate in a valley between the nubs.

The connecting element, Which is, for example, a wire (bond wire) of an AlSi material, extends to the junction fastened to the plate and is electrically connected and mechanically bonded to the junction, which can be accomplished by soldering or, again, by ultrasonic welding.

Preferably, the junction is on a terminal contact—as is commonly the case in electronic construction—and the terminal contact is fastened on the plate, especially by cementing. An electrical cable, for example, runs from the junction to an electronic circuit whose sensor forms the conductor track or tracks.

The conductor track whose thickness is substantially less than that of the plate, and amounts for example to about 100 nm, is preferably applied to the plate by a screen printing method, a sputtering process or by a vapor depositing method.

To protect the connecting element, and especially protect it against corrosion, it is embedded in a protective mass which extends from the junction to beyond the location of the ultrasonic weld. The protective mass is, for example, a thermosetting epoxide, and is selected to provide good adhesion to the combined plate and conductor track.

The bond that has been described can be used, for example, on a glass ceramic plate of a cooking burner, sensor areas forming the conductor tracks and the junctions being connected to an electronic sensing system. The bond described can also be used on glass plates which form the viewing windows of a fireplace, for example an open fireplace, or a bake oven.

The bond described can also be used in operator shielding of glass containing controls or in windows of refrigeration and freezing equipment which are heated to prevent condensation.

Other advantageous embodiments of the invention are to be found in the subordinate claims and in the following description of one embodiment.

The FIGURE shows a schematic cross section of a method of connection.

A glass ceramic plate 1 has a surface 2 as a surface for supporting cooking utensils. On its other surface 3 nubs 4 are provided. The nub height amounts for example to 50 microns to 200 microns. Conventional radiant heating systems are associated with the glass ceramic plate 1. At least one conductor track 5 is applied to the surface 3 by screen printing, sputtering or vapor deposition. The conductor track 5 serves in cooking surfaces as a sensor surface for pot recognition or temperature measurement. The conductor track 5 can serve in the door of a microwave oven as an electromagnetic shield. In bake oven doors or fireplace screens it can be provided for safety reasons for temperature detection. The conductor track 5 consists of a gold layer which is applied in the form of a resinate paste by the screen printing method. The conductor track 5 has a thickness of about 100 nm. It follows the course of the peaks and valleys of the nubs (see FIGURE).

A terminal contact 6 is fastened to the surface 3 by means of an adhesive 7. The terminal contact 6 spans two or more nubs, the nub valleys being filled with the adhesive 7. The terminal contact 6 bears a plurality of electrically conductive connection surfaces 8, one of which is seen in the FIGURE. An electrical cable 9 is connected in a zone 10 to the terminal surface or surfaces 8. The cable 9 leads to an electronic circuit. In the zone 10 a solder connection or a plug connection can be provided, in which case the one part of the plug connection is then fastened to the terminal contact 6.

A connecting element formed by a piece of wire 11 is provided for connecting the terminal surface 8 to the conductor track 5. The wire 11 is a bond wire made of an AlSi material. The wire has, for example, a diameter of about 0.1 mm.

One end of the wire 11 is ultrasonically welded to the composite consisting of the glass ceramic plate 1 and the conductor track 5. The ultrasonic weld is indicated symbolically at 12. The welded-on wire 11 and the weld 12 terminate preferably at the surface of or advantageously in the conductor track 5 since it is through these that the information must be transmitted. The weld 12 lies in a valley between nubs, thereby preventing impairment of the especially delicate conductor track 5. The ultrasonic welding brings it about that the wire 11 is connected not only to the conductor track 5 and the latter only adheres by the bonding effect produced when the conductor track 5 is applied to the glass ceramic plate 1. By the ultrasonic welding an additional bonding of the conductor track 5 to the glass ceramic plate 1 in the area of the ultrasonic weld point 12 is achieved, and the end effect is that the end of the wire 11 is ultrasonically welded at the weld point 12 to the glass ceramic plate 1. The resistance to traction amounts to at least 200 cN. The great strength of the bond is due to the ultrasonic weld, even though the thermal expansion coefficients of the glass ceramic plate 1 and conductor track 5 are extremely different. In the case of the bond AlSi wire 11 and conductor track 5, especially a gold conductor track, these are very structile [ductile?] materials which, favored by the thin layer, absorb expansion differences. The thermal conductivity of the glass ceramic is low. It is around 1.5 W/mK. On the other hand the thermal conductivity of the conductor track 5 is high.

The electrical contact resistance between the conductor track 5 and the wire 11 is low due to the ultrasonic welding. It is less than 0.1 ohm.

The ultrasonic welded connection is also resistant to temperature change and corrosion-proof, which.is especially advantageous if, as is the case with cooking utensils, for example, the connection is exposed to high temperatures and moisture.

The wire 11 runs in a free loop over one or more nubs 4 to the connection surface 8 and is bonded thereto at a point 13. A soldered connection, a welded connection, ultrasonic weld connection or a clip connection can be provided at point 13. The free flexure of the wire 11 between points 12 and 13 provides a certain elasticity or flexibility, which is favorable to tolerance compensation and compensation for different expansions due to heat.

To protect the wire 11 and junctions 12 and 13 against environmental influences a protective mass 14 in the form of a bead is provided, which envelops the wire 11 and covers the junctions 12 and 13. The protective mass 14 consists, for example, of a thermosetting epoxide.

The conductor track 5 can serve as a sensory surface for various applications. It can serve for pot recognition on a cook surface or as a temperature sensor, having a temperature-dependent resistance for the purpose.

What is claimed is:

1. Connection of at least one electrical junction comprising a composite comprising a conductor track applied to a glass or ceramic having a working surface, an electrically conductive connecting element being ultrasonically welded to the composite, the elements extending to the junction and being in contact with and fastened to said plate, wherein the conductor track is applied to a nubby surface of the plate and the connecting element is ultrasonically welded in a valley between nubs to the composite of conductor track and plate.

2. Connection according to claim 1, wherein the conductor track is formed by a noble metal layer whose thermal expansion coefficient is substantially higher than that of the plate.

3. Connection according to claim 1, wherein the conductor track is applied to the plate by a method selected from the group consisting of a screen printing process, sputtering process and a vapor deposition process.

4. Connection according to claim 1, wherein the thickness of the conductor track is about 100 nm.

5. Connection according to claim 1, wherein the connecting element is wire.

6. Connection according to claim 5, wherein the piece of wire has a thickness of about 10 microns.

7. Connection according to claim 1, wherein the connecting element consists of an AlSi material.

8. Connection according to claim 1, wherein the connecting element extends in a loop over at least one nub to the junction.

9. Connection according to claim 1, wherein the connecting element is embedded in a protective mass which extends from the junction to beyond the point of the ultrasonic weld.

10. Connection according to claim 1, wherein the junction is disposed as a connection surface on a terminal contact which is fastened on the plate by means of a cement.

11. Connection according to claim 1, wherein the terminal contact spans two or more nubs.

12. Connection according to claim 1, wherein the connection is configured such that the electrical contact resistance between the conductor track and the connecting element is less than 0.1 ohm.

13. Connection according to claim 1, wherein the conductor tracks form sensor surfaces and the connection point is electrically connected to an electronic sensor system.

14. A fireplace screen comprising the connection of claim 1 and a screen.

15. An oven comprising the connection of claim 1 and an oven window pane.

* * * * *